United States Patent
Chang et al.

(10) Patent No.: US 9,193,581 B1
(45) Date of Patent: Nov. 24, 2015

(54) MEMS MICROPHONE PACKAGE STRUCTURE HAVING AN IMPROVED CARRIER AND A METHOD OF MANUFACTURING SAME

(71) Applicant: MERRY ELECTRONICS (SHENZHEN) CO., LTD., Shenzhen (CN)

(72) Inventors: Chao-Sen Chang, Taichung (TW); Yong-Shiang Chang, Taichung (TW); Jen-Yi Chen, Taichung (TW); Chun-Chieh Wang, Taichung (TW)

(73) Assignee: Merry Electronics (Shenzhen) Co., Ltd., Shenzhen (CN)

( * ) Notice: Subject to any disclaimer, the term of this patent is extended or adjusted under 35 U.S.C. 154(b) by 0 days.

(21) Appl. No.: 14/448,529

(22) Filed: Jul. 31, 2014

(51) Int. Cl.
*H04R 19/00* (2006.01)
*B81B 7/00* (2006.01)
*B81C 1/00* (2006.01)

(52) U.S. Cl.
CPC ........... *B81B 7/0077* (2013.01); *B81C 1/00333* (2013.01)

(58) Field of Classification Search
CPC ................... H01L 2924/00; H01L 2924/3025; H01L 2924/1461; H04R 19/04
See application file for complete search history.

(56) References Cited

U.S. PATENT DOCUMENTS

2011/0186943 A1* 8/2011 Pahl et al. ..................... 257/416

* cited by examiner

*Primary Examiner* — Roy Potter
*Assistant Examiner* — Paul Patton
(74) *Attorney, Agent, or Firm* — Bacon & Thomas, PLLC

(57) ABSTRACT

An MEMS microphone package structure includes a substrate, a carrier and an acoustic transducer. The carrier covers the substrate from above and connects to the substrate. The carrier has an n-shaped cross section and includes a flat plate portion, a sidewall connected to the flat plate portion, and two oblique blocks protruded from the inner surface of the sidewall. The oblique blocks each have an inclined surface for connecting the flat plate portion and the bottom surface of the sidewall. The acoustic transducer is posited on the bottom surface of the flat plate portion and electrically connected to the substrate through a plurality of electrical conduction paths passing through the inclined surfaces. The electrical conduction paths are conducive to simplification of wirings of the substrate and the thinning of the substrate. Therefore, simplify the manufacturing process to reduce the manufacturing time and cost.

9 Claims, 6 Drawing Sheets

US 9,193,581 B1

MEMS MICROPHONE PACKAGE STRUCTURE HAVING AN IMPROVED CARRIER AND A METHOD OF MANUFACTURING SAME

BACKGROUND OF THE INVENTION

1. Technical Field

The present invention relates to MEMS microphone package structures, and more particularly, to an MEMS microphone package structure including a carrier and an acoustic transducer disposed on the carrier, wherein the carrier has an inclined surface for use in three-dimensional layout, and the acoustic transducer is electrically connected through the carrier to a substrate, so as to render a thinner substrate and thus increase the volume of a back chamber.

2. Description of Related Art

Unlike conventional microphones, MEMS microphones are advantageously lightweight, compact, power-saving, and cheap. Hence, MEMS microphones are applied widely to electro-acoustical products, such as cellular phones. Referring to FIG. 1, a conventional MEMS microphone package structure 70 comprises a substrate 71. An acoustic transducer 72 and an application-specific integrated circuit (ASIC) chip 73 which are electrically connected and disposed on the substrate 71. The ASIC chip 73 is electrically connected to external components through an electrical connection structure 75 on the substrate 71. Referring to FIG. 1, the electrical connection paths of the components in the conventional MEMS microphone package structure 70 are all designed in the substrate 71, whereas the substrate 71 has to be formed with multilayer to contain the complicated circuit layout. It is disadvantageous for the thinning of conventional electro-acoustical products. Furthermore, the volume of the back chamber 74 in MEMS microphone package structure 70 is decreased because of the presence of components therein. Hence, by decreasing the thickness of the substrate 71, it is practicable to spare some space for increasing the volume of the back chamber 74, and augmenting not only the sensitivity but the performance, such as signal-to-noise ratio and frequency response.

BRIEF SUMMARY OF THE INVENTION

In view of the aforesaid drawbacks of the prior art, it is an objective to provide a MEMS microphone package structure and a method of manufacturing same, which is characterized advantageously by not only increasing the volume of a microphone back chamber without changing the appearance and dimensions of package structure but manufacturing in a simpler process.

In order to achieve the above objectives, the present invention provides an MEMS microphone package structure, which has a carrier with an inclined surface having thereon wirings. The MEMS microphone package structure comprises a substrate, a carrier, an ASIC and an acoustic transducer. The carrier covers the substrate from above and connects to the substrate. The carrier is a hollow square-shaped cap and includes a flat plate portion, a sidewall connected to the periphery of the flat plate portion, and at least two oblique blocks protruding inward from the sidewall. The oblique blocks each have an inclined surface which connects the flat plate portion bottom surface and the sidewall bottom surface and faces the substrate. The carrier further has a plurality of electrical conduction paths passing through the inclined surfaces before reaching the substrate. A sound hole is formed at the flat plate portion. The acoustic transducer corresponds in position to the sound hole and connects to the flat plate portion. The acoustic transducer is electrically connected to the electrical conduction paths on the bottom surface of the flat plate portion.

Moreover, the present invention further provides a method of manufacturing an MEMS microphone package structure, comprising the steps: (a) providing a combo carrier formed from a plurality of carriers arranged in an array, wherein the carriers each include a flat plate portion, a sound hole disposed at the flat plate portion, a sidewall connected to the periphery of the flat plate portion, and at least two oblique blocks protruding inward from the sidewall, wherein the oblique blocks each have an inclined surface which connects the bottom surface of the flat plate portion and the bottom surface of the sidewall and faces away from the bottom surfaces of the carriers; (b) producing at least an electrical conduction path on the inclined surfaces of the oblique blocks by a laser direct structuring process, and disposing an acoustic transducer corresponding in position to the sound hole on the bottom surface of the carrier; and (c) providing a combo substrate formed from a plurality of substrates arranged in an array, connecting the combo substrate to the combo carrier, and performing singulation to cut out each package structure.

Hence, the acoustic transducer is electrically connected to the substrate through the electrical conduction paths, so as to simplify wirings (circuit or layout) in the substrate, render the substrate thin, and thus increase the volume of the back chamber of the microphone. Moreover, the manufacturing process is simpler and thus conducive to mass production and thus cost reduction.

DETAILED DESCRIPTION OF THE INVENTION

Figure 1:
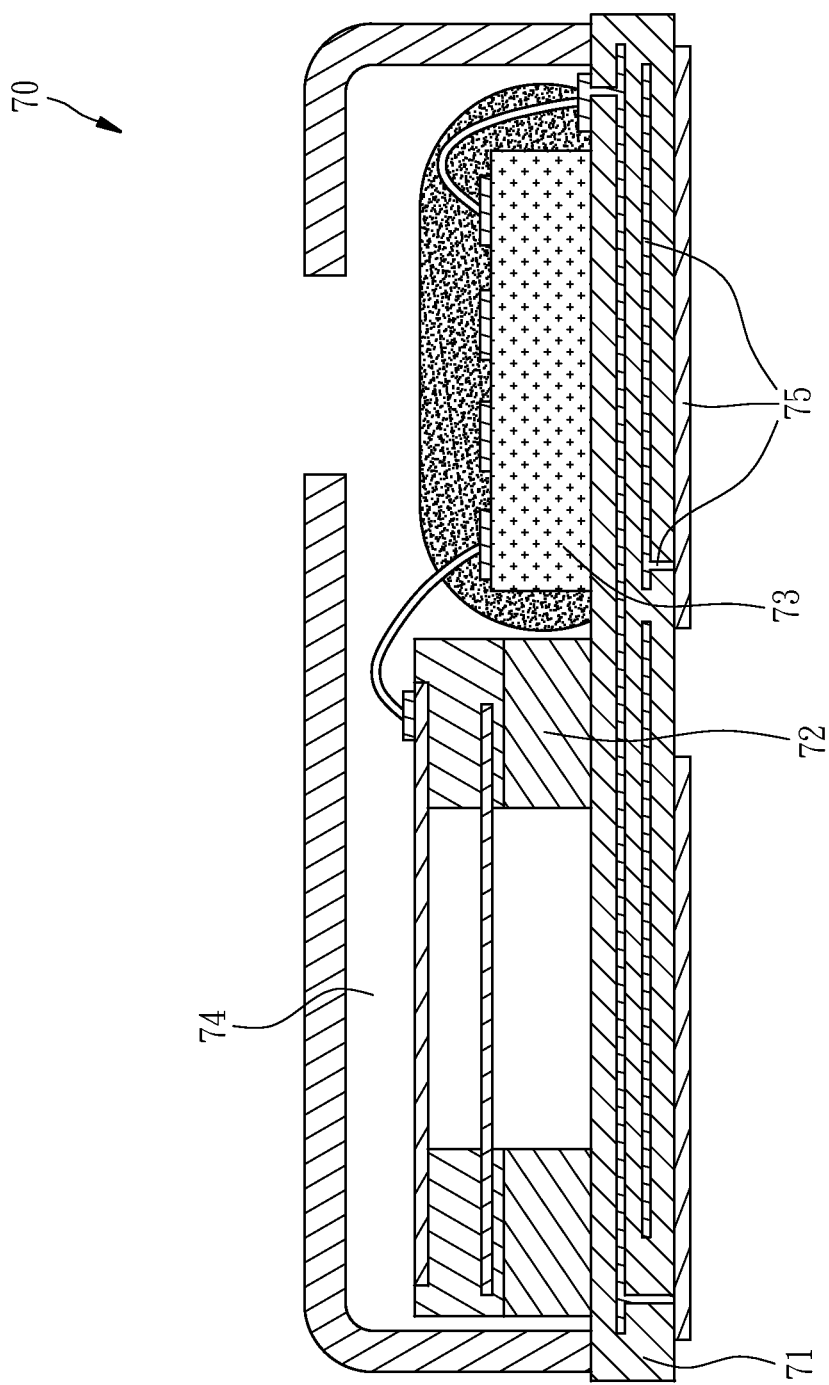
FIG. 1 (PRIOR ART) is a cross-sectional view of a conventional MEMS microphone package structure.
Figure 2:
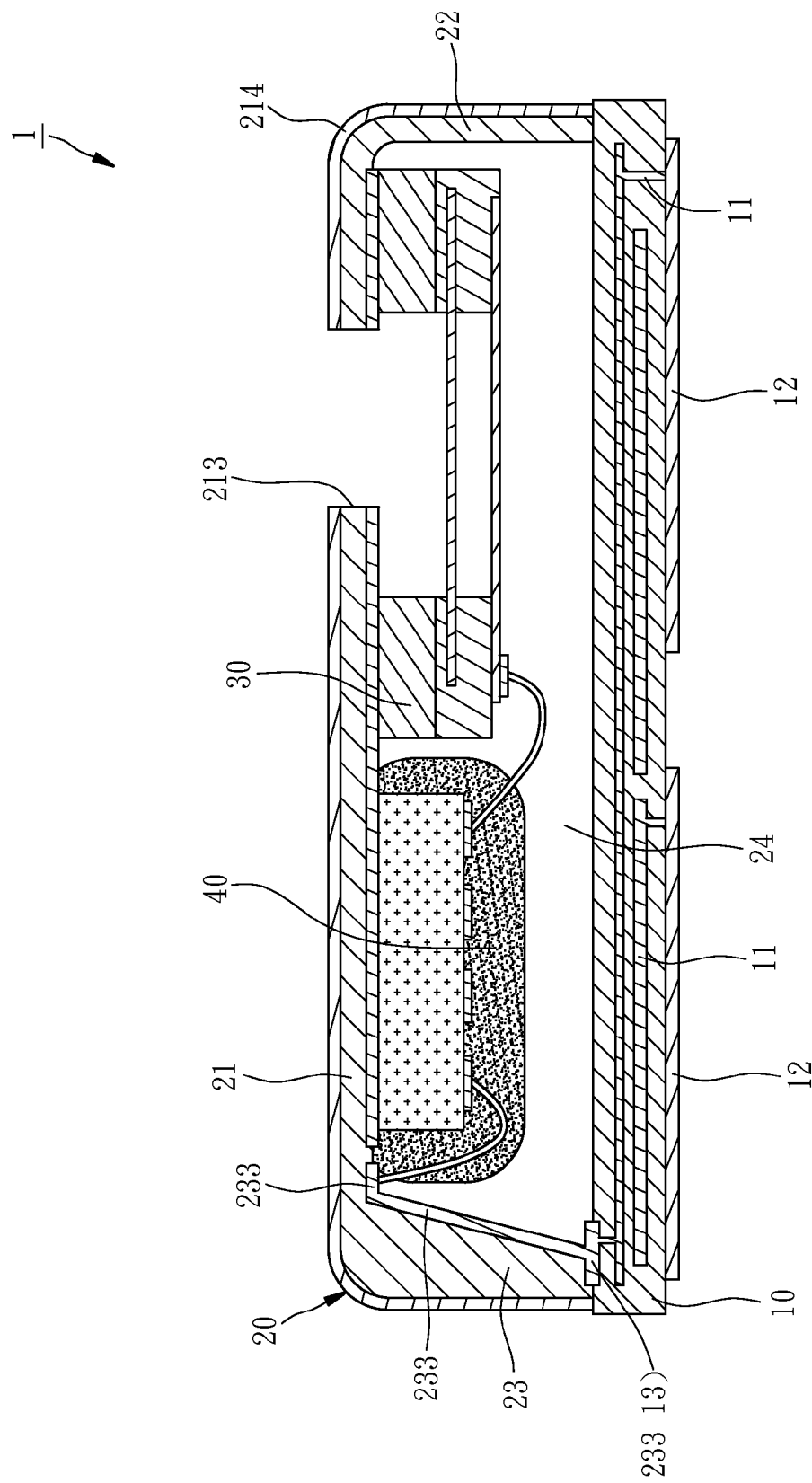
FIG. 2 is a cross-sectional view of an MEMS microphone package structure according to the first embodiment of the present invention.
Figure 3:
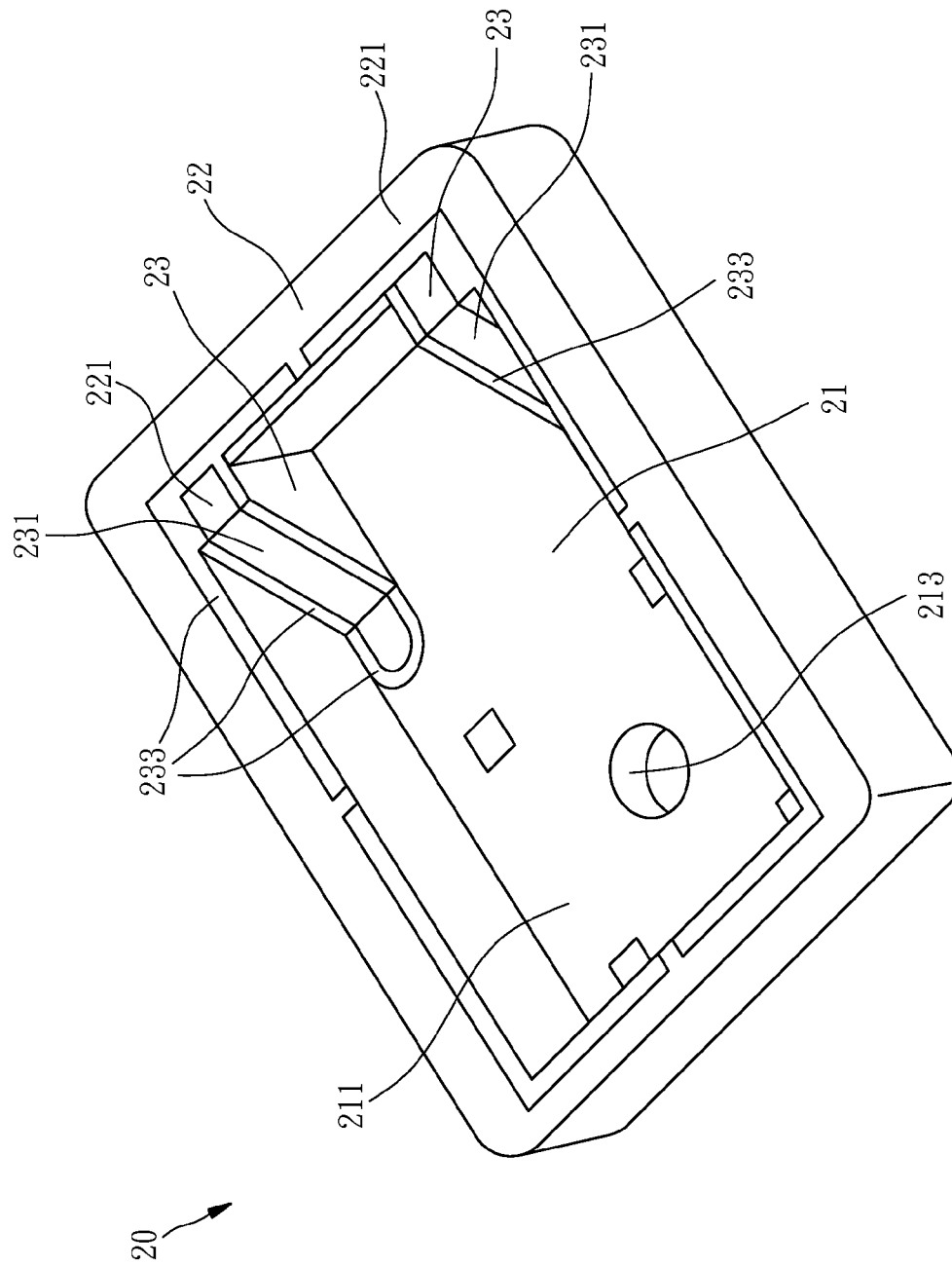
FIG. 3 is a perspective view of a carrier according to the first embodiment of the present invention.

To enable persons skilled in the art to gain insight into the features of the present invention, the present invention is hereunder illustrated with a first embodiment and depicted by drawings. Referring to FIG. 2 and FIG. 3, an MEMS microphone package structure 1 according to the present invention, include a substrate 10, a carrier 20, and an acoustic transducer 30.

Referring to FIG. 2, the substrate 10 is a multilayer board. A plurality of wiring electrodes 13 and metal bumps 12 are designed on a top surface and a bottom surface of the substrate 10, respectively. The metal bumps 12 are electrically connected to the wiring electrodes 13 through a plurality of electrical connection structures 11 in the substrate 10. The package structure 1 is electrically connected to an external component (not shown) through the metal bumps 12. The substrate 10 is provided in the form of a glass substrate (such as FR-4) or a plastic substrate (such as LCP).

The carrier 20, which is a hollow square-shaped cap, covers the substrate 10 from above and connects to the substrate 10. The carrier 20 has a flat plate portion 21 and a sidewall 22 connected to the periphery of a bottom surface 211 of the flat plate portion 21. Referring to FIG. 3, there is shown a bottom perspective view of the carrier 20. Two opposing ends of the sidewall 22 protrude inward to form two oblique blocks 23 which are spaced apart. The oblique blocks 23 each have an inclined surface 231 which faces downward (i.e., faces the substrate 10) and is flat. The bottom surface 211 of the flat plate portion 21 adjoins a bottom surface 221 of the sidewall 22 through the inclined surface 231. Therefore, it is practicable to produce a plurality of electrical conduction paths 233 by laser direct structuring, wherein the plurality of electrical conduction paths 233 thus produced passes through the bottom surface 211 of the flat plate portion 21, the inclined surfaces 231, and eventually the bottom surface 221 of the sidewall 22. Moreover, a sound hole 213 is disposed at the flat plate portion 21 of the carrier 20 to enable passage of sound, and the outer surface of the carrier 20 is optionally plated with a metal layer 214 for effectuating electromagnetic interference shielding.

Referring to FIG. 2, the acoustic transducer 30 corresponds in position to the sound hole 213 and mounts to the flat plate portion 21. An ASIC chip 40 is not only disposed between the acoustic transducer 30 and the sidewall 22 but also mounted to the flat plate portion 21. The acoustic transducer 30 is electrically connected to the ASIC chip 40 by wire bonding, whereas the ASIC chip 40 is electrically connected to the flat plate portion 21 by wire bonding and then protected by encapsulation.

To start operating, the MEMS microphone receives a sound wave. Afterward, all electro-acoustical signals generated as a result of a conversion process performed with the acoustic transducer 30 and the ASIC chip 40 are transmitted to the substrate 10 through the electrical conduction paths 233 and then transmitted to any components outside the MEMS microphone through the substrate 10. Unlike a conventional MEMS microphone package structure, the electrical connection paths required for the acoustic transducer 30 and the ASIC chip 40 of the present invention are designed on the carrier 20, and thus the wirings on the substrate 10 are greatly decreased and simplified to thereby render it easy to thin the substrate 10. Hence, the MEMS microphone package structure 1 enhances not only the volume of a back chamber 24 without changing appearance and dimension but the performance, such as signal-to-noise ratio. Furthermore, with the substrate 10 being thinned, the package structure 1 can be thinned further.

Moreover, with the inclined surfaces 231 being flat, during the laser direct structuring process whereby the electrical conduction paths 233 are produced, a laser beam is moved linearly in a direction parallel to the bottom surface 211 of the flat plate portion 21, such that the laser beam forms points of metal jointing on the inclined surfaces 231 and eventually produces the electrical conduction paths 233. The laser direct structuring process does not require rotating the carrier 20 or changing the angle of the laser beam. Hence, the laser direct structuring process is simple and speedy, thereby saving time and costs.

In this embodiment, the electrical conduction paths 233 are disposed separately on the inclined surfaces 231 of different oblique blocks 23, so as to prevent mutual signal interference between the electrical conduction paths 233, but the present invention is not limited to this embodiment, as persons skilled in the art can decrease or increase the oblique blocks 23 as needed. Alternatively, the inclined surfaces 231 can be continuous curved surfaces, provided that the inclined surfaces 231 adjoin the bottom surfaces 211, 221 of the flat plate portion 21 and the sidewall 22 and the laser beam forms the points of metal jointing on the curved surfaces continuously and unceasingly during the laser direct structuring process.

Figure 4:
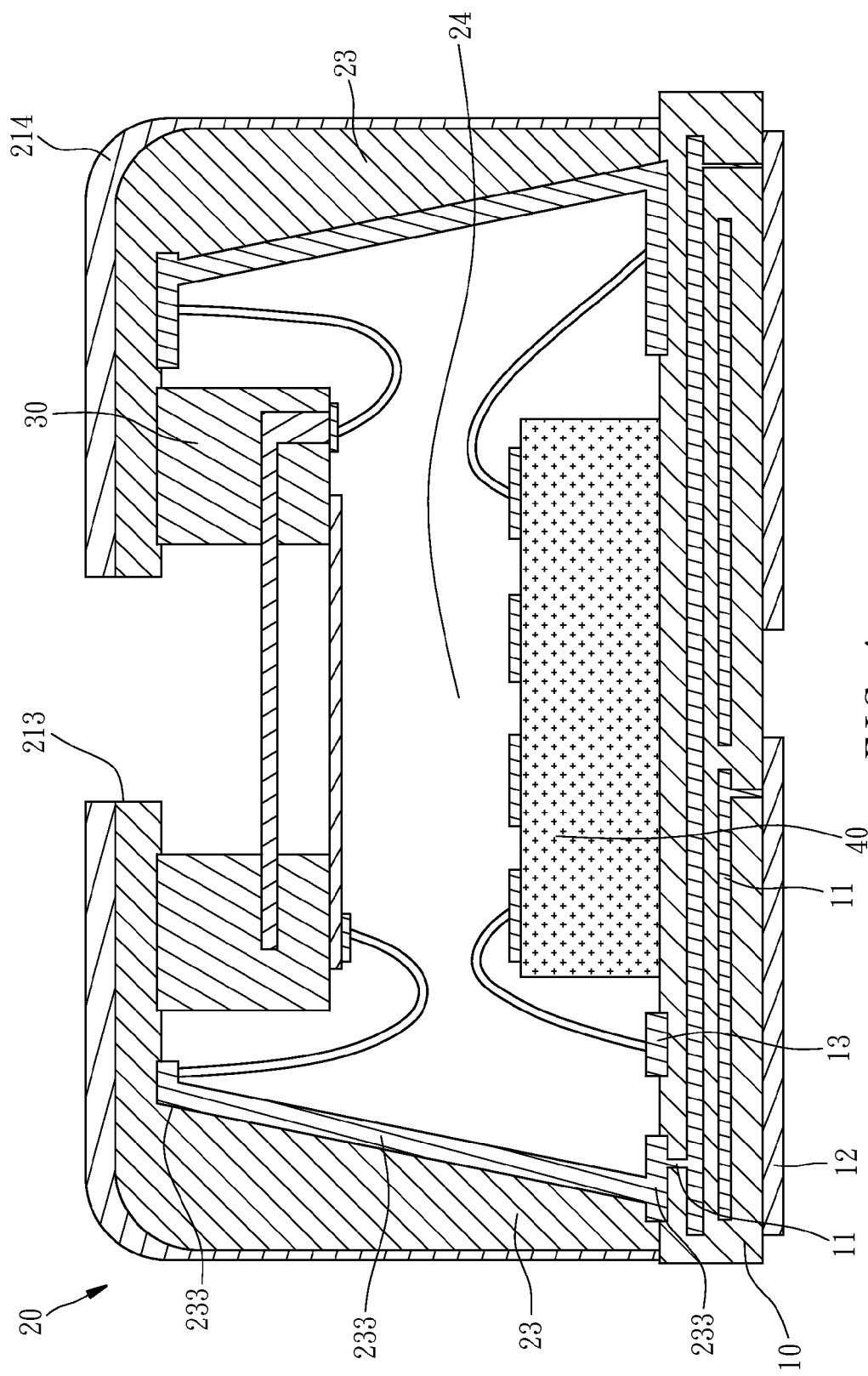
FIG. 4 is a cross-sectional view of an MEMS microphone package structure according to the second embodiment of the present invention.

The present invention further provides a second embodiment. Referring to FIG. 4, essential components of the second embodiment are substantially the same as that of the first embodiment, except that the two oblique blocks 23 are disposed on two sides of the acoustic transducer 30, respectively, whereas the ASIC chip 40 is disposed on the substrate 10 and below the acoustic transducer 30. After being connected by wire bonding, the acoustic transducer 30 gets electrically connected to the substrate 10 through the electrical conduction paths 233, and then the acoustic transducer 30 gets electrically connected to the ASIC chip 40 through the wirings (such as the electrical connection structures 11 and the wiring electrodes 13) on the substrate 10. Hence, some wires for use in electrical connection are disposed on the carrier 20, such that the wires on the substrate 10 are simplified and decreased to thereby facilitate the thinning of the substrate 10.

Figure 5:
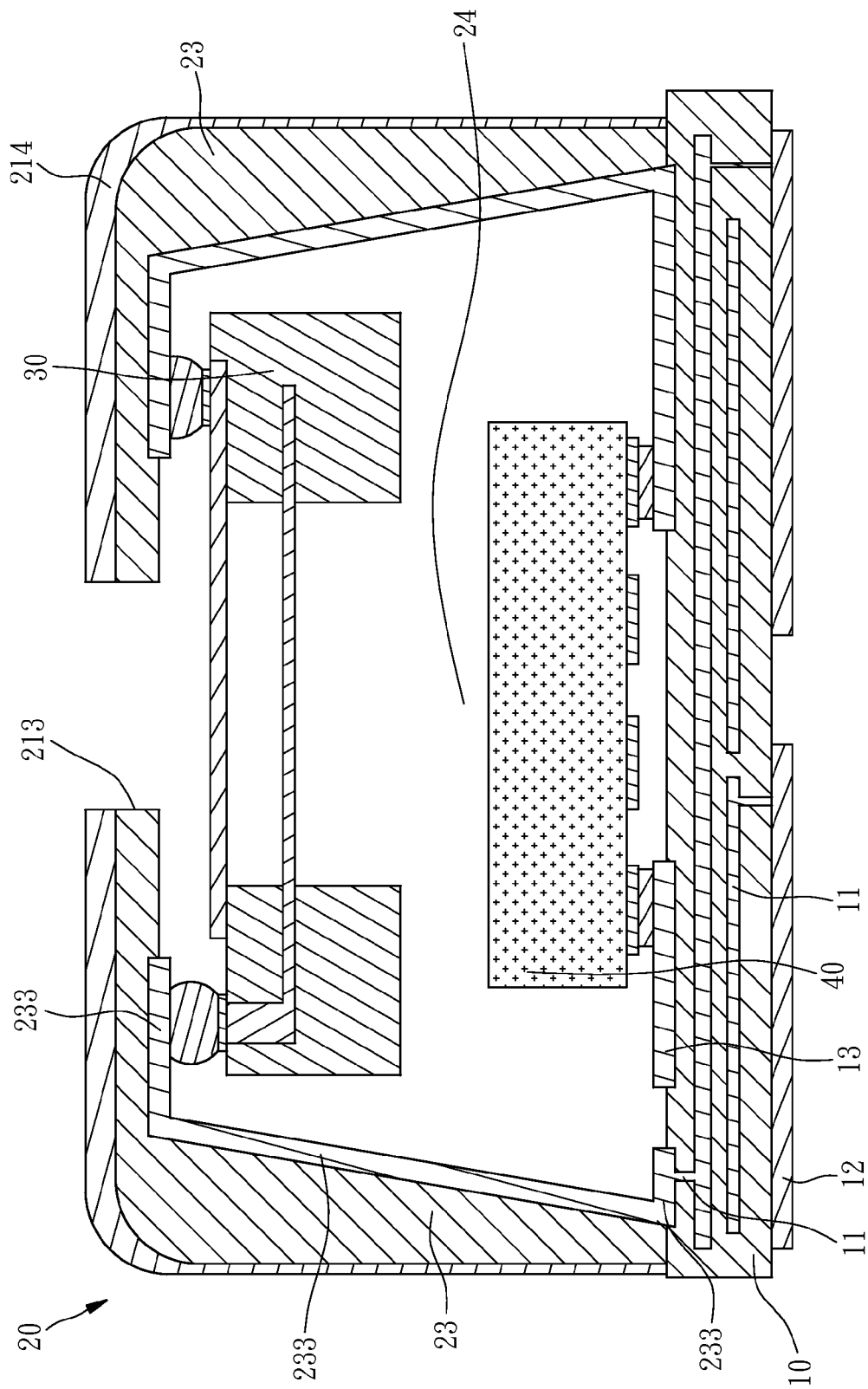
FIG. 5 is a cross-sectional view of an MEMS microphone package structure according to the third embodiment of the present invention.

The present invention further provides a third embodiment. Referring to FIG. 5, the essential components of the third embodiment are substantially the same as that of the second embodiment, except that the electrical connection of the acoustic transducer 30 and the ASIC chip 40 is effectuated by flip chip, thereby simplifying the wirings on the substrate 10.

Figure 6:
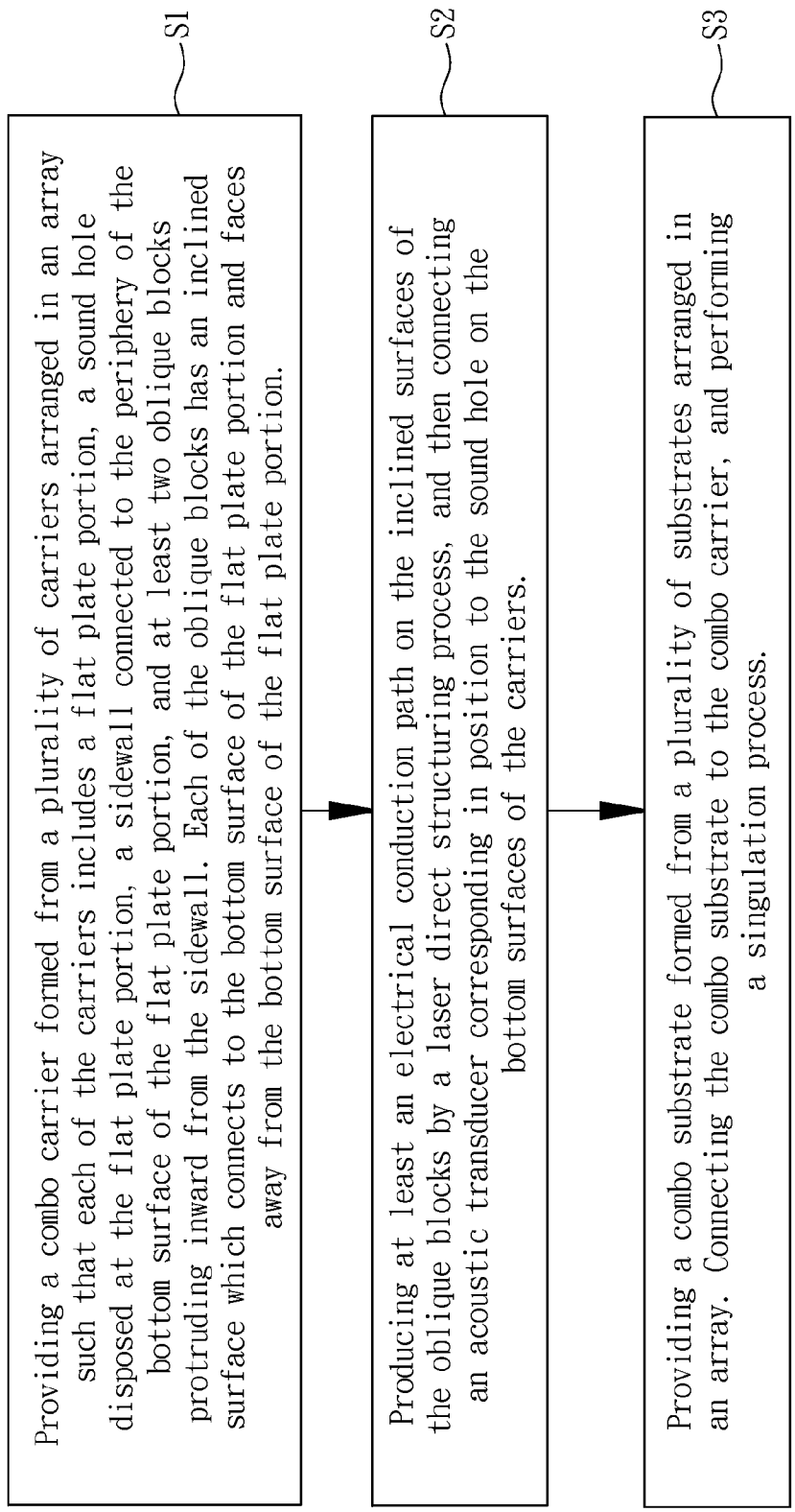
FIG. 6 is a schematic view of the process flow of a method of manufacturing a package structure according to the present invention.

Moreover, the present invention is advantageously conducive to mass production. Referring to FIG. 6, there is shown a schematic view of the process flow of a method of manufacturing a package structure according to the present invention. The method is described below.

First, in step S1, a combo carrier formed from a plurality of carriers 20 arranged in an array is integrally formed by injection molding, for example, such that the carriers 20 each include a flat plate portion 21, a sound hole 213 disposed at the flat plate portion 21, a sidewall 22 connected to the periphery of the bottom surface 211 of the flat plate portion 21, and at least two oblique blocks 23 protruding inward from the sidewall 22. The oblique blocks 23 each have an inclined surface 231 which connects the bottom surface 211 of the flat plate portion 21 and the bottom surface 221 of the sidewall 22 and faces away from the bottom surface of the flat plate portion 21. The carrier 20 is reinforced by three-dimensional structures, such as the sidewall 22. Hence, the combo carrier of a large surface area can be produced in a single instance of a manufacturing process to thereby preclude warpage, enhance the efficiency of the manufacturing process, and cut the manufacturing costs.

Afterward, step S2 entails producing a plurality of electrical conduction paths 233 on the bottom surface 211 of the flat plate portion 21, the inclined surfaces 231 of the oblique blocks 23, and the bottom surface 221 of the sidewall 22 by a laser direct structuring process, providing a plurality of acoustic transducer 30 and a plurality of the ASIC chip 40 which are disposed at the bottom surface 211 of the flat plate portion 21 and correspond in position to the sound hole 213, and are disposed between the sidewall 22 and the acoustic transducer 30, respectively, and electrically connecting the acoustic transducer 30, the ASIC chip 40 and the electrical conduction paths 233 in sequence by wire bonding. Moreover, in this step, the outer surface of the carrier 20 is optionally plated with a metal layer 214.

Finally, step S3 entails providing a combo substrate formed from a plurality of substrates 10 arranged in an array, disposing required wirings on the substrates 10, connecting the combo substrate to the combo carrier, and performing singulation to cut out each package structure 1.

The constituent elements described in the above embodiments of the present invention are illustrative rather than restrictive of the scope of the present invention. All readily conceivable structural changes made to the above embodiments as well as replacement and variations of equivalent elements must be interpreted to fall within the claims of the present invention.

What is claimed is:

1. An MEMS microphone package structure having an improved carrier, comprising:
   a substrate;
   a carrier for covering the substrate from above and connecting to the substrate, the carrier including a flat plate portion, a sidewall connected to a periphery of the flat plate portion, and at least two oblique blocks protruding inward from the sidewall, the oblique blocks each having an inclined surface facing the substrate and connecting a bottom surface of the flat plate portion to a bottom surface of the sidewall, the carrier having at least two electrical conduction paths, wherein at least a portion of each of the at least two electrical conduction paths passing through the inclined surfaces, the flat plate portion having a sound hole; and
   an acoustic transducer corresponding in position to the sound hole, connected to the flat plate portion, and electrically connected to the electrical conduction paths on the bottom surface of the flat plate portion; and
   wherein the electrical conduction paths extend on the inclined surfaces, respectively.

2. The MEMS microphone package structure as claimed in claim 1, wherein the inclined surface is a flat surface or a curved surface.

3. The MEMS microphone package structure as claimed in claim 1, wherein a metal layer is disposed on an outer surface of the carrier.

4. The MEMS microphone package structure as claimed in claim 1, further comprising an application-specific integrated circuit (ASIC) chip disposed between the sidewall and the acoustic transducer and connected to the flat plate portion.

5. The MEMS microphone package structure as claimed in claim 1, further comprising an application-specific integrated circuit (ASIC) chip corresponding in position to the acoustic transducer and disposed on the substrate.

6. The MEMS microphone package structure as claimed in claim 1, wherein the carrier is a hollow square-shaped cap.

7. The MEMS microphone package structure as claimed in claim 1, wherein the at least two electrical conduction paths passing through the inclined surfaces to effectuate communication between the bottom surface of the flat plate portion and the bottom surface of the sidewall.

8. A method of manufacturing an MEMS microphone package structure, the method comprising the steps of:
   (a) providing a combo carrier formed from a plurality of carriers arranged in an array, the carriers each including a flat plate portion, a sound hole disposed at the flat plate portion, a sidewall connected to a periphery of the flat plate portion, and at least two oblique blocks protruding inward from the sidewall, wherein the oblique blocks each have an inclined surface connecting a bottom surface of the flat plate portion to a bottom surface of the sidewall and facing away from the bottom surface of the flat plate portion;
   (b) producing at least an electrical conduction path on the inclined surfaces of the oblique blocks by a laser direct structuring process, and connecting a acoustic transducer corresponding in position to the sound hole on bottom surfaces of the carriers; and
   (c) providing a combo substrate formed from a plurality of substrates arranged in an array, connecting the combo substrate to the combo carrier, and performing singulation to cut out each package structure.

9. The method as claimed in claim 8, wherein, in step (b), a metal layer is disposed on an outer surface of the carrier.

* * * * *